(12) United States Patent
Ishihara et al.

(10) Patent No.: US 10,004,145 B2
(45) Date of Patent: Jun. 19, 2018

(54) COMBINED WIRING BOARD AND METHOD FOR MANUFACTURING THE SAME

(71) Applicant: IBIDEN CO., LTD., Ogaki-shi (JP)

(72) Inventors: Teruyuki Ishihara, Ogaki (JP); Michimasa Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 639 days.

(21) Appl. No.: 14/496,028

(22) Filed: Sep. 25, 2014

(65) Prior Publication Data

US 2015/0083471 A1    Mar. 26, 2015

(30) Foreign Application Priority Data

Sep. 25, 2013 (JP) ................... 2013-198631

(51) Int. Cl.
| | | |
|---|---|---|
| *H05K 1/14* | (2006.01) | |
| *H05K 1/11* | (2006.01) | |
| *H05K 3/36* | (2006.01) | |
| *H05K 3/00* | (2006.01) | |
| *H05K 1/02* | (2006.01) | |
| *H05K 3/34* | (2006.01) | |

(52) U.S. Cl.
CPC ........... *H05K 3/0097* (2013.01); *H05K 1/142* (2013.01); *H05K 3/36* (2013.01); *H05K 1/0298* (2013.01); *H05K 1/11* (2013.01); *H05K 3/0052* (2013.01); *H05K 3/34* (2013.01); *H05K 2201/0909* (2013.01); *H05K 2201/09127* (2013.01); *H05K 2203/0169* (2013.01); *Y10T 29/49126* (2015.01)

(58) Field of Classification Search
CPC ............... H05K 3/0097; H05K 3/0052; H05K 2201/0909; H05K 2201/09127; H05K 1/0298; H05K 3/34; H05K 2203/0169; Y10T 29/49126

See application file for complete search history.

(56) References Cited

U.S. PATENT DOCUMENTS

| | | | | |
|---|---|---|---|---|
| 5,661,086 A | * | 8/1997 | Nakashima | ......... H01L 21/4803 257/668 |
| 7,307,853 B2 | * | 12/2007 | Funada | ................ H05K 3/0052 174/254 |
| 9,603,238 B2 | * | 3/2017 | Takahashi | ............ H05K 1/0271 |
| 2014/0131074 A1 | | 5/2014 | Ishihara et al. | |
| 2014/0133110 A1 | | 5/2014 | Takahashi et al. | |
| 2014/0133111 A1 | | 5/2014 | Ishihara et al. | |

FOREIGN PATENT DOCUMENTS

JP    2011-023657 A    2/2011

OTHER PUBLICATIONS

U.S. Appl. No. 14/492,424, filed Sep. 22, 2014, Ishihara, et al.
U.S. Appl. No. 14/465,127, filed Aug. 21, 2014, Ishihara, et al.

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A combined wiring board includes a metal frame having multiple opening portions, and multiple wiring boards accommodated in the opening portions in the metal frame, respectively. The opening portions in the metal frame have side walls having holding portions such that the holding portions hold the wiring boards in the opening portions in the metal frame, and the metal frame has slit portions adjacent to the holding portions and connecting portions connecting the slit portions to the opening portions.

20 Claims, 13 Drawing Sheets

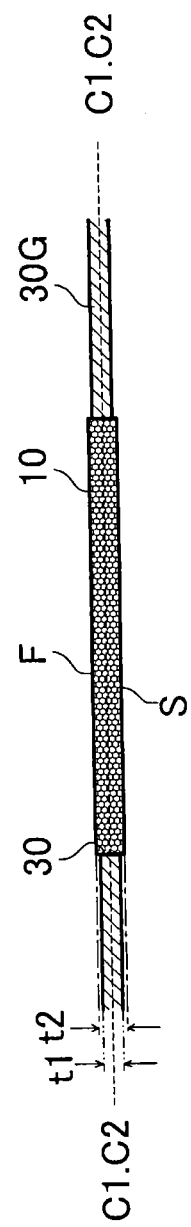
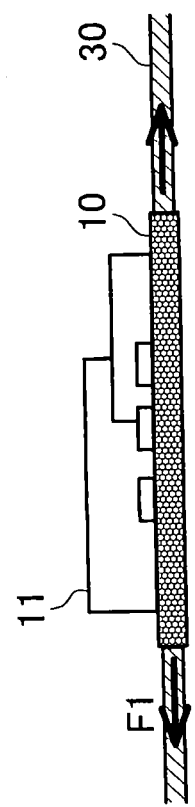

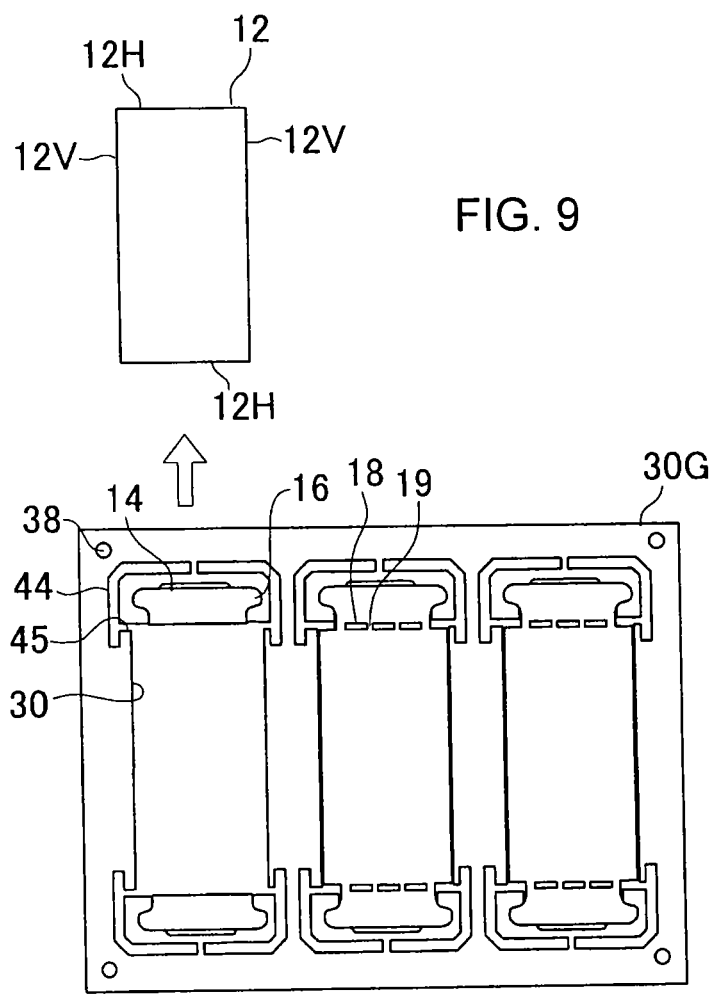

COMBINED WIRING BOARD AND METHOD FOR MANUFACTURING THE SAME

CROSS-REFERENCE TO RELATED APPLICATIONS

The present application is based upon and claims the benefit of priority to Japanese Patent Application No. 2013-198631, filed Sep. 25, 2013, the entire contents of which are incorporated herein by reference.

BACKGROUND OF THE INVENTION

Field of the Invention

The present invention relates to a combined wiring board where multiple wiring boards to be reflowed are fixed to a metal frame, and to a method for manufacturing such a combined wiring board.

Description of Background Art

When mounting an electronic component on a wiring board and conducting other procedures on the wiring board, such procedures may be collectively performed not on one single wiring board but on a combined wiring board where multiple identical wiring boards are accommodated in a wiring-board accommodation kit. JP2011-23657A describes a multipiece wiring-board accommodation kit made up of multiple piece wiring boards and a frame having accommodation holes to accommodate those piece wiring boards. The entire contents of this publication are incorporated herein by reference.

SUMMARY OF THE INVENTION

According to one aspect of the present invention, a combined wiring board includes a metal frame having multiple opening portions, and multiple wiring boards accommodated in the opening portions in the metal frame, respectively. The opening portions in the metal frame have side walls having holding portions such that the holding portions hold the wiring boards in the opening portions in the metal frame, and the metal frame has slit portions adjacent to the holding portions and connecting portions connecting the slit portions to the opening portions.

According to another aspect of the present invention, a method for manufacturing a combined wiring board includes preparing multiple wiring boards, preparing a metal frame having multiple opening portions, positioning the wiring boards in the opening portions in the metal frame, respectively, and forming multiple holding portions in side walls of the opening portions in the metal frame by plastic deformation such that the holding portions hold the wiring boards in the opening portions in the metal frame. The metal frame has slit portions adjacent to the holding portions and connecting portions connecting the slit portions to the opening portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7(A)-7(B) are enlarged cross-sectional views of part of a combined wiring board;

FIG. 9 is a plan view showing the main body of a printed wiring board separated from the combined wiring board;

DETAILED DESCRIPTION OF THE EMBODIMENTS

Figure 1:
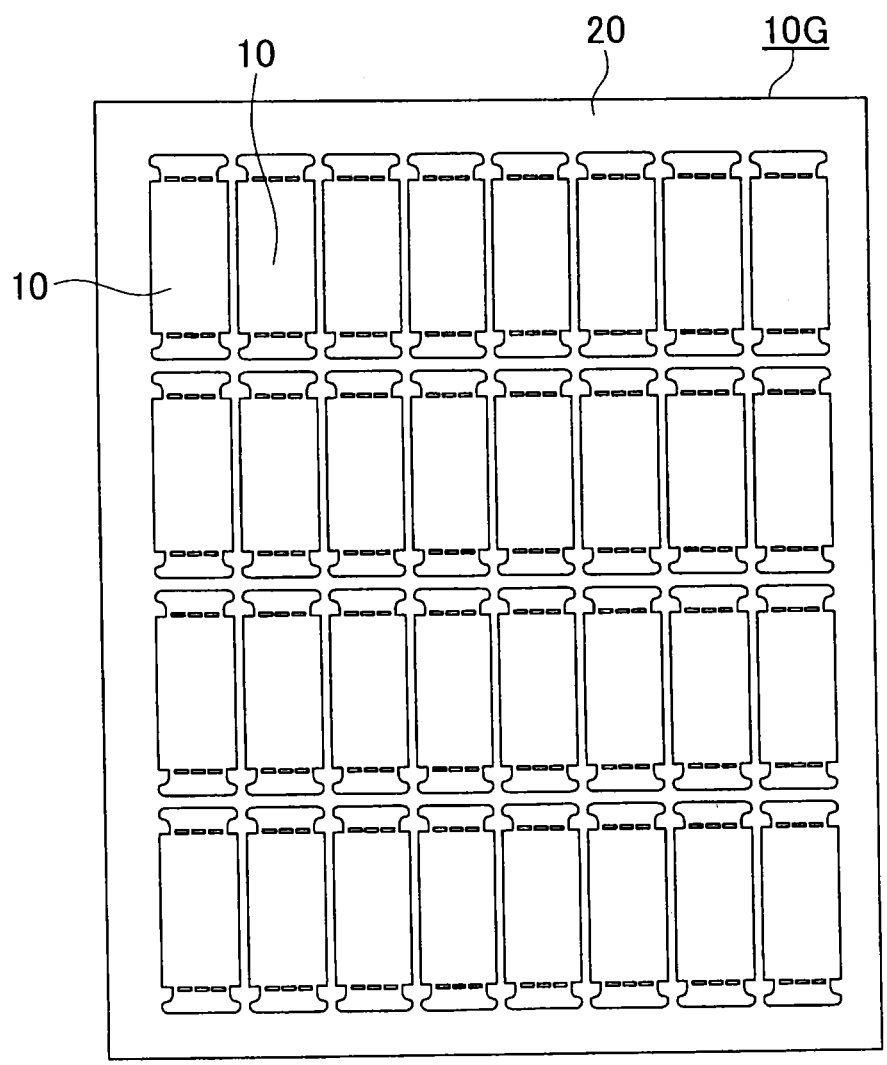
FIG. 1 is a plan view of a multipiece printed wiring board.

The embodiments will now be described with reference to the accompanying drawings, wherein like reference numerals designate corresponding or identical elements throughout the various drawings.

First Embodiment

Figure 10:
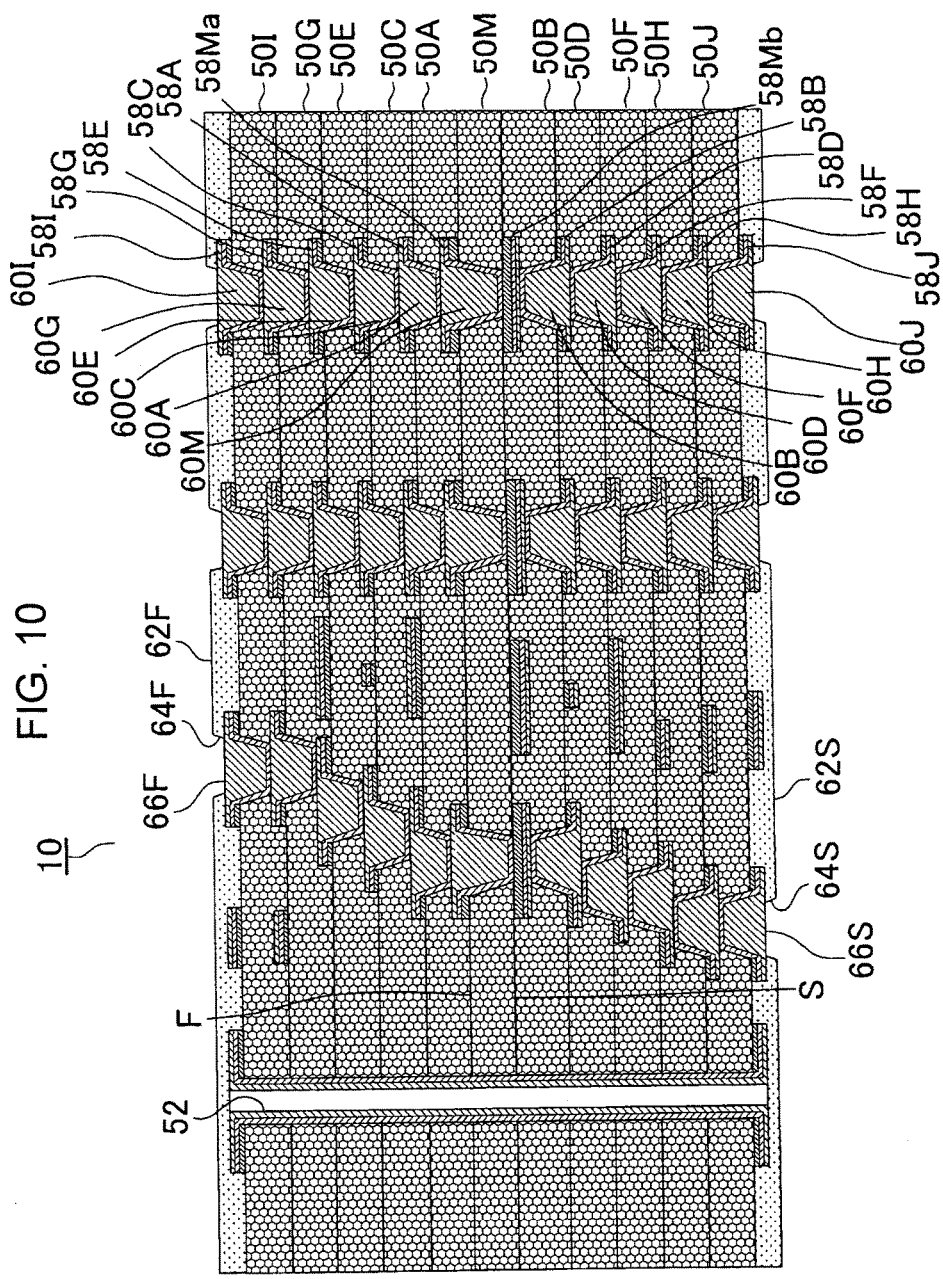
FIG. 10 is a cross-sectional view of a printed wiring board according to a first embodiment.

FIG. 10 is a cross-sectional view of printed wiring board 10 according to a first embodiment before an electronic component is mounted thereon. In printed wiring board 10, interlayer insulation layers (50A, 50C, 50E, 50G, 50I) are laminated on the first-surface (F) side of core insulation layer (50M) positioned in the center, and interlayer insulation layers (50B, 50D, 50F, 50H, 50J) are laminated on the second-surface (S) side. Conductive circuit (58Ma) on first surface (F) of core insulation layer (50M) and conductive circuit (58Mb) on second surface (S) are connected by via conductor (60M).

In interlayer insulation layer (50A) laminated on the first-surface (F) side of core insulation layer (50M), via conductor (60A) is formed to connect conductive circuit (58A) on interlayer insulation layer (50A) to conductive circuit (58Ma) of core insulation layer (50M). In interlayer insulation layer (50C) laminated on interlayer insulation layer (50A), via conductor (60C) is formed to connect conductive circuit (58C) on interlayer insulation layer (50C) to conductive circuit (58A) on interlayer insulation layer (50A). In interlayer insulation layer (50E) laminated on interlayer insulation layer (50C), via conductor (60E) is formed to connect conductive circuit (58E) on interlayer insulation layer (50E) to conductive circuit (58C) on interlayer insulation layer (50C). In interlayer insulation layer (50G) laminated on interlayer insulation layer (50E), via conductor (60G) is formed to connect conductive circuit (58G) on interlayer insulation layer (50O) to conductive circuit (58E) on interlayer insulation layer (50E). In interlayer insulation layer (50I) laminated on interlayer insulation layer (50G), via conductor (60I) is formed to connect conductive circuit (58I) on interlayer insulation layer (50I) to conductive circuit (58G) on interlayer insulation layer (50G). Solder-resist layer (62F) is formed on interlayer insulation layer (50I), and conductive circuit (58I) exposed from opening (64F) of the solder-resist layer works as pad (66F).

In interlayer insulation layer (50B) laminated on the second-surface (S) side of core insulation layer (50M), via conductor (60B) is formed to connect conductive circuit (58B) on interlayer insulation layer (50B) to conductive circuit (58Mb) of core insulation layer (50M). In interlayer insulation layer (50D) laminated on interlayer insulation layer (50B), via conductor (60D) is formed to connect conductive circuit (58D) on interlayer insulation layer (50D) to conductive circuit (58B) on interlayer insulation layer (50B). In interlayer insulation layer (50F) laminated on interlayer insulation layer (50D), via conductor (60F) is formed to connect conductive circuit (58F) on interlayer insulation layer (50F) to conductive circuit (58D) on interlayer insulation layer (50D). In interlayer insulation layer (50H) laminated on interlayer insulation layer (50F), via conductor (60H) is formed to connect conductive circuit (58H) on interlayer insulation layer (50H) to conductive circuit (58F) on interlayer insulation layer (50F). In interlayer insulation layer (50J) laminated on interlayer insulation layer (50H), via conductor (60J) is formed to connect conductive circuit (58J) on interlayer insulation layer (50J) to conductive circuit (58H) on interlayer insulation layer (50H). Solder-resist layer (62S) is formed on interlayer insulation layer (50J), and conductive circuit (58J) exposed from opening (64S) of the solder-resist layer works as pad (66S). Through hole 52 is formed penetrating through interlayer insulation layers (50I, 50G, 50E, 50C, 50A, 50M, 50B, 50D, 50F, 50H, 50J).

Figure 11:
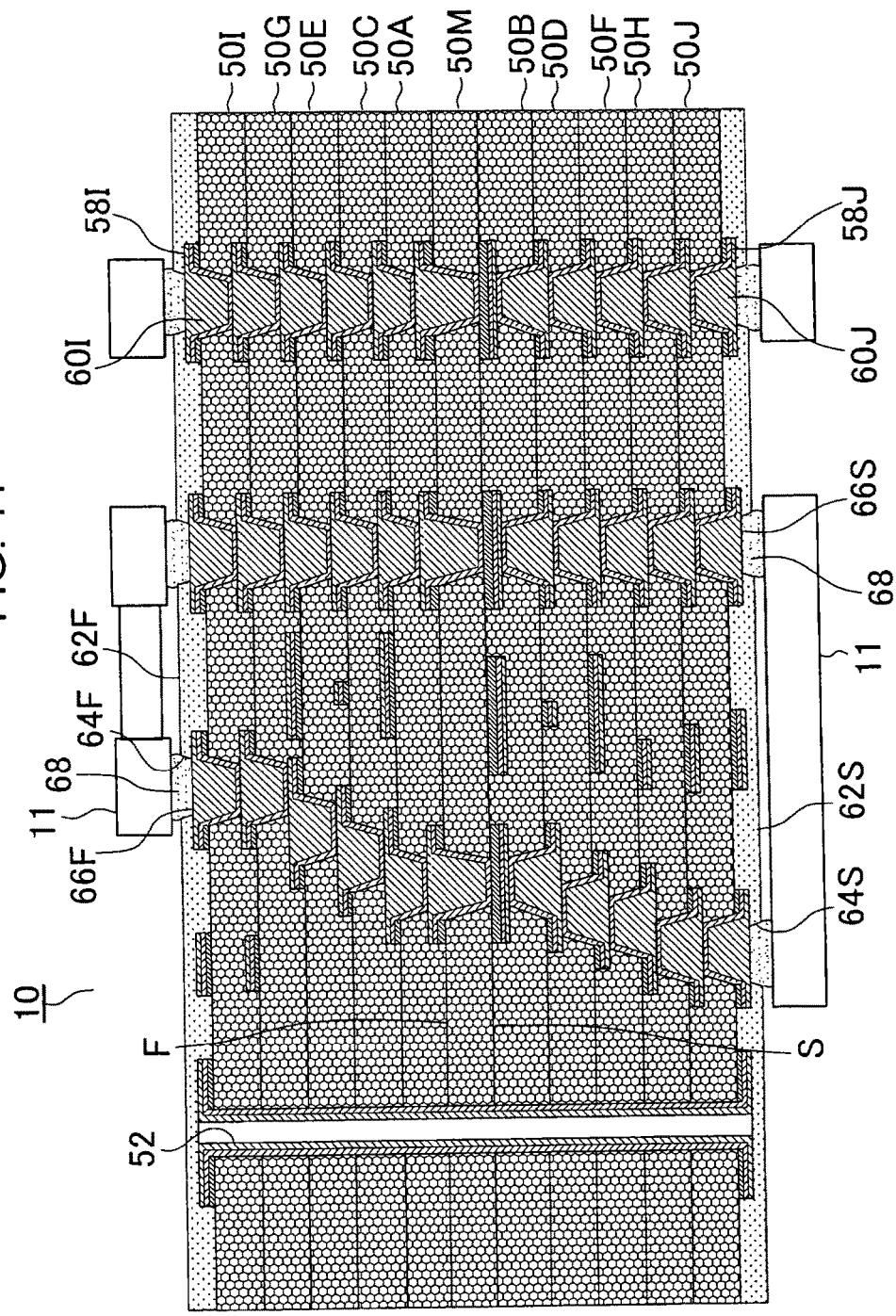
FIG. 11 is a cross-sectional view of a printed wiring board with mounted electronic components according to the first embodiment.

FIG. 11 is a cross-sectional view of printed wiring board 10 with mounted electronic components 11. On the first-surface (F) side of printed wiring board 10, electronic component 11 is mounted through solder 68 provided on pad (66F), and on the second-surface (S) side of printed wiring board 10, electronic component 11 is mounted through solder 68 provided on pad (66S).

Figure 2:
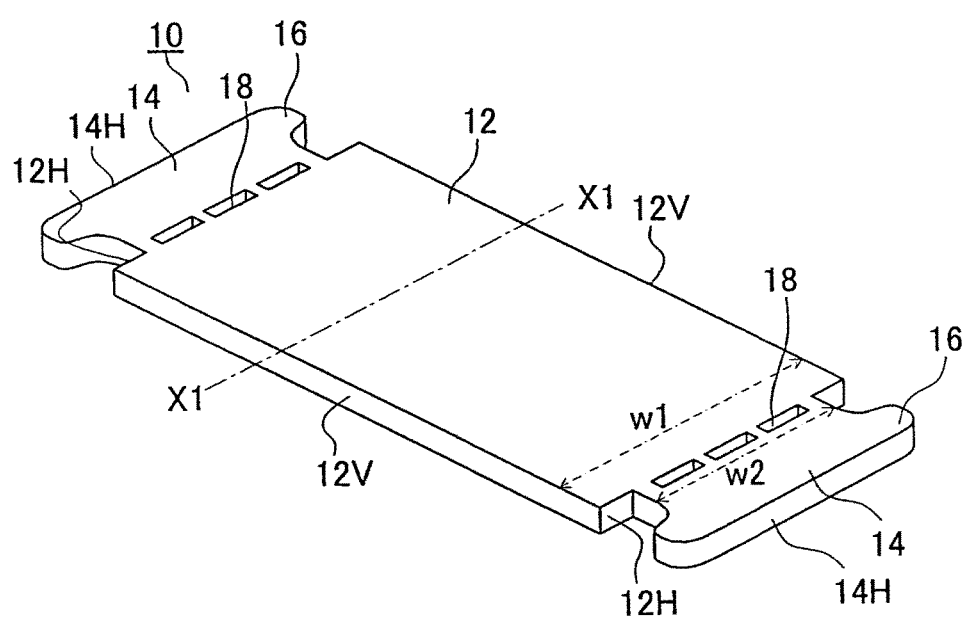
FIG. 2 is a perspective view of a printed wiring board cut out as an individual piece.

FIG. 1 is a plan view of multipiece printed wiring board (10G) where 8×4 printed wiring boards 10 are manufactured. FIG. 2 is a perspective view of printed wiring board 10 cut out into an individual piece. FIG. 10 shows part of the cross section taken at (X1-X1) in FIG. 2. As shown in FIG. 1, multiple printed wiring boards 10 are manufactured inside frame 20, which is formed along the periphery of multipiece printed wiring board (10G). As shown in FIG. 2, printed wiring board 10 has rectangular main body 12 structured to have short-side sidewalls (12H) and long-side sidewalls (12V). To each of short-side sidewalls (12H) on either side of main body 12, extension piece 14 is attached to be integrated with main body 12, extending in a direction along long-side sidewall (12V). Extension pieces (14, 14) are formed to face each other by sandwiching main body 12, and are each formed to have end wall (edge side) (14H), which is parallel to short-side sidewall (12H) of main body 12. Width (w2) of extension piece 14 is narrower than width (w1) of main body 12. Extension piece 14 and main body 12 are connected by bridge portion 19, which is formed along short-side sidewall (12H) with slits for cutting out the main body (hereinafter referred to as cut-out slits 18). A pair of protruding tabs 16 are attached to each extension piece 14 to protrude in a direction perpendicular to the direction in which extension piece 14 extends (in a direction along long-side sidewall (12V)).

Figure 3A:
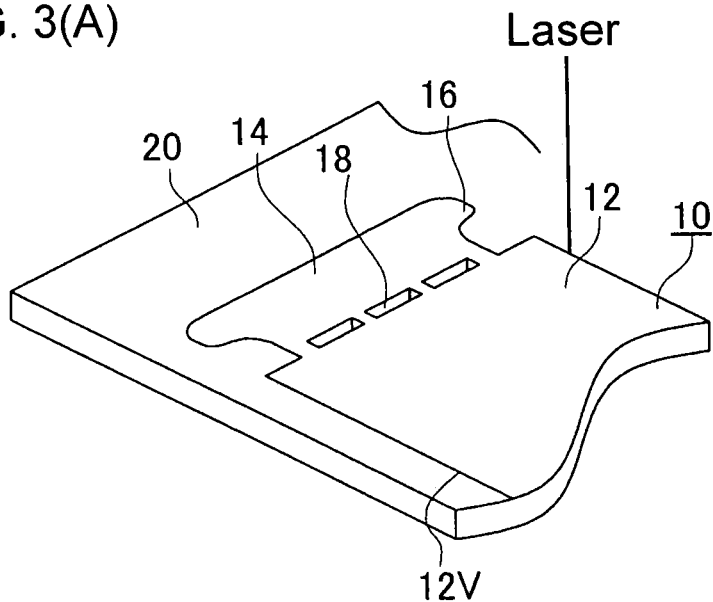
FIG. 3(A)-3(B) are perspective views of a printed wiring board under laser processing.
Figure 3B:
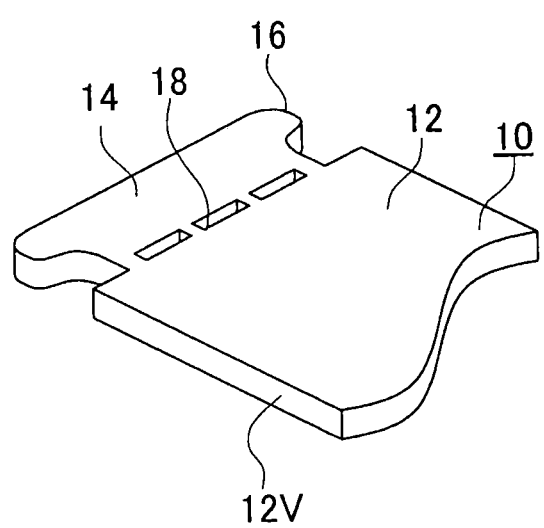

In the first embodiment, when printed wiring board 10 is cut out from multipiece wiring board (10G), a laser is used to cut along the outline of printed wiring board 10 as shown in FIG. 3(A) and an individual piece is cut out as shown in FIG. 3(B). Prior to cutting along the outline of printed wiring board 10, cut-out slits 18 are formed by a laser.

Figure 4A:
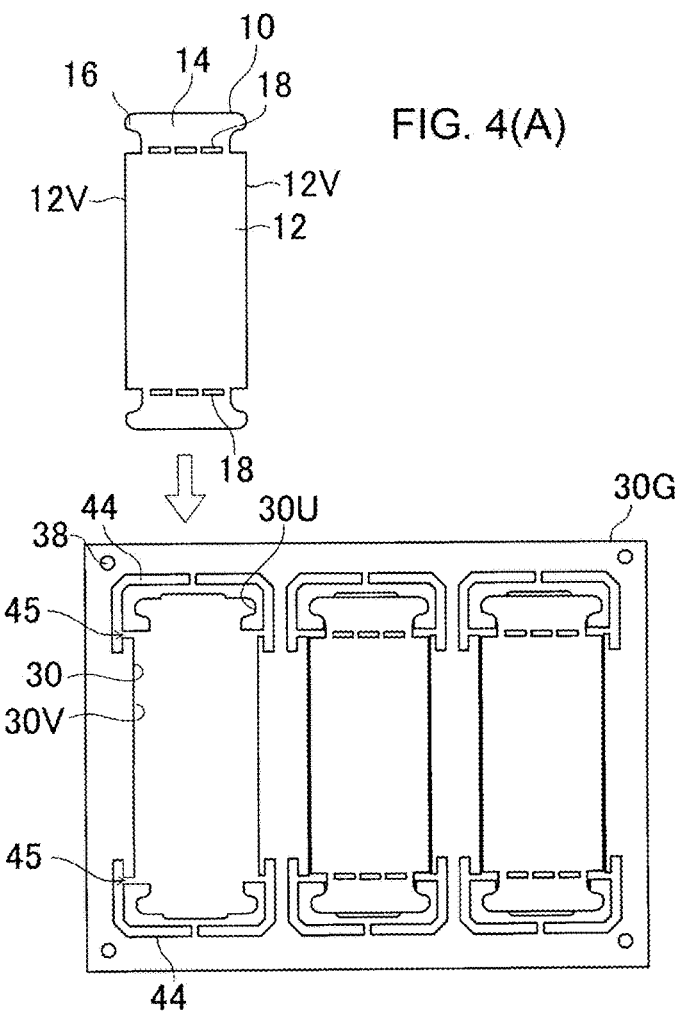
FIG. 4(A) is a plan view of a metal frame, and 4(B) is a plan view of a combined wiring board.

FIG. 4(A) is a plan view of metal frame (30G) made of aluminum. Metal frame (30G) has three accommodation openings 30, each for accommodating printed wiring board 10, and alignment holes 38 are formed at the four corners of the frame. On the periphery of opening 30, L-shaped slits 44 and connecting portions 45 are formed to adjust stress.

Figure 4B:
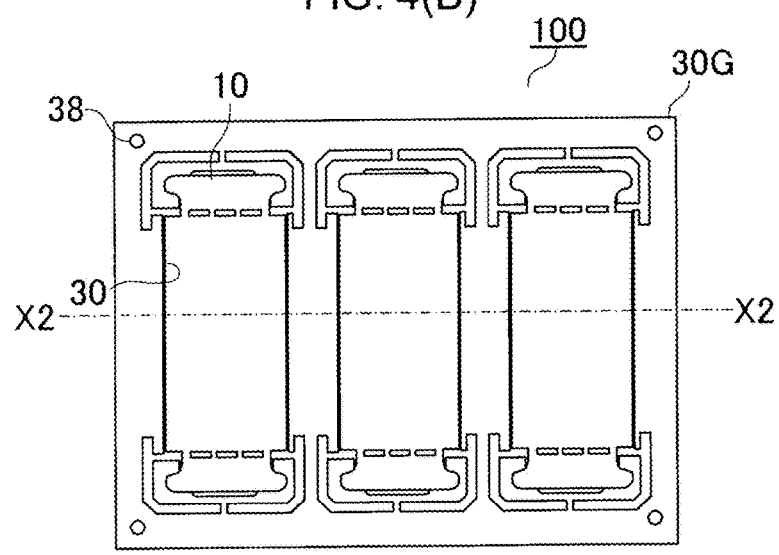

FIG. 4(B) shows a state where printed wiring boards 10 are fixed into all the accommodation openings 30 of metal frame (30G). FIG. 7(A) shows a cross-sectional view showing part of printed wiring board 10 taken at (X2-X2) in FIG. 4(B). Metal frame (30G) is set to have a thickness (t1) of 750 μm, and printed wiring board 10 is set to have a thickness (t2) of 780 μm. Namely, the thickness of metal frame (30G) is less than that of printed wiring board 10. In addition, printed wiring board 10 is fixed to metal frame (30G) so that its center plane (C2) in a thickness direction corresponds to center plane (C1) of metal frame (30G) in the thickness direction. Therefore, metal frame (30G) is recessed from upper surface (first surface) (F) of printed wiring board 10, and metal frame (30G) is recessed from lower surface (second surface) (S) of printed wiring board 10. Accordingly, when electronic components are mounted on printed wiring boards 10, metal frame (30G) will not interfere with the mounting procedure.

The coefficient of thermal expansion along a main surface of metal frame (30G) made of aluminum is 23 ppm/° C., and the coefficient of thermal expansion along a main surface of printed wiring board 10 made of resin is 16 ppm/° C. The thermal expansion coefficient of metal frame (30G) is higher than that of printed wiring board 10. The thickness of metal frame (30G) is set to be less than that of printed wiring board 10 so that warping caused by a difference in thermal expansion coefficients is suppressed in printed wiring board 10. Aluminum is used as the material for the metal frame in the first embodiment, but copper, stainless steel or the like may also be used as long as its thermal expansion coefficient is higher than that of printed wiring boards 10.

Figure 5:
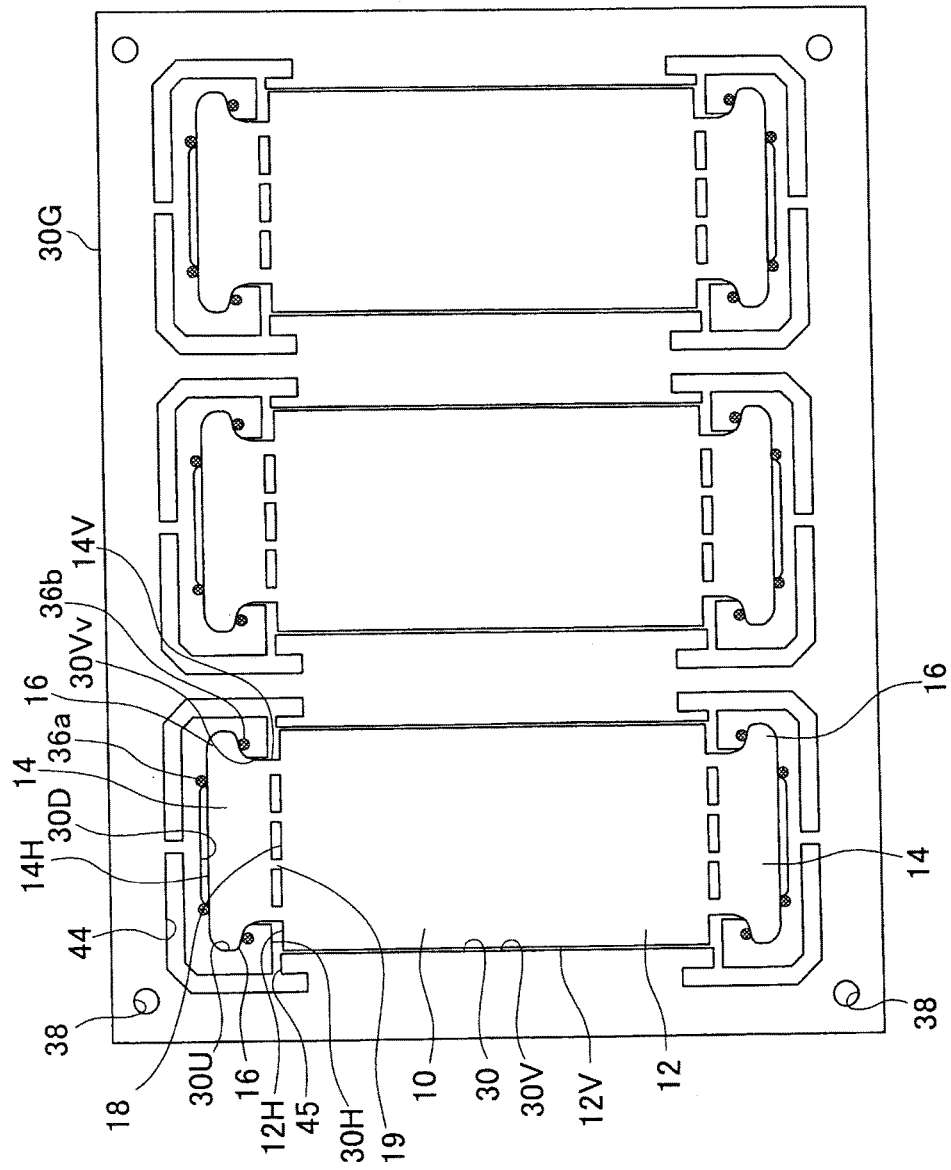
FIG. 5 is a plan view of a crimp-processed combined wiring board.

FIG. 5 shows a state where printed wiring board 10 is fixed to accommodation opening 30 of metal frame (30G). Accommodation opening 30 has long-side sidewall (30V) facing long-side sidewall (12V) of main body 12, short-side sidewall (30H) facing short-side sidewall (12H) of main body 12, extension-side sidewall (30Vv) facing extension-side sidewall (14V) of extension piece 14, and recess (30D) facing end wall (14H) of extension piece 14, and U-shaped portion (30U) making surface contact with protruding tab 16 by abutting partially the sidewall of the protruding tab. A predetermined clearance is provided between long-side sidewall (12V) of main body 12 and long-side sidewall (30V), and between extension-side sidewall (14V) of extension piece 14 and extension-side sidewall (30Vv). In addition, a predetermined clearance is formed by the rest of U-shaped portion (30U) where no surface contact is made with the sidewall of protruding tab 16 (see FIG. 6). Since printed wiring board 10 expands more in a long-side direction (in a direction along long-side sidewall (12V)), a space greater than the above predetermined clearance is provided between end wall (14H) of extension piece 14 and recess (30D). Accordingly, interference is prevented between recess (30D) and end wall (14H), and stress on end wall (14H) is suppressed when printed wiring board 10 undergoes thermal deformation.

First crimped portion (36a) is formed at the base of U-shaped portion (30U) of opening 30, which is at the border between U-shaped portion (30U) and recess (30D). Second crimped portion (36b) is formed at the border of U-shaped portion (30U) and extension-side sidewall (30Vv). First crimped portion (36a) and second crimped portion (36b) cause the sidewall of U-shaped portion (30U) to be bonded to the sidewall of protruding tab 16 as they abut each other when plastic deformation occurs. Accordingly, printed wiring board 10 is held in place by metal frame (30G). Except for protruding tab 16 bonded by first crimped portion (36a) and second crimped portion (36b) (holding portion), sidewalls of printed wiring board 10 do not make contact with sidewalls of opening 30. The distance from the center of printed wiring board 10 to first crimped portion (36a) is greater than the distance from the center to second crimped portion (36b).

Figure 6:
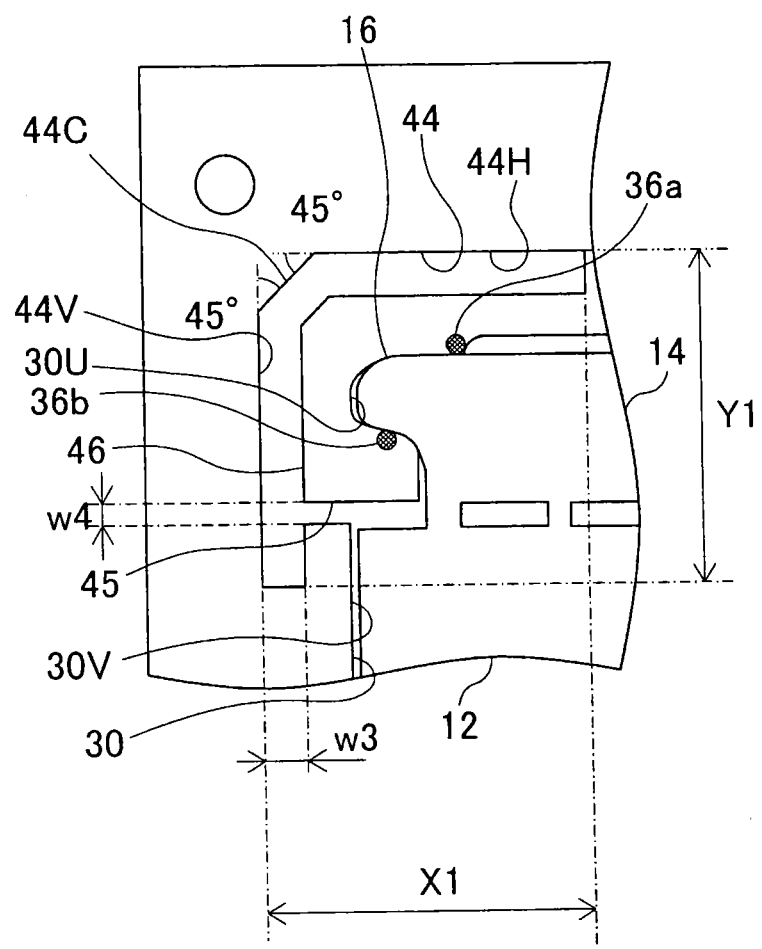
FIG. 6 is an enlarged view of an L-shaped slit and a connecting portion in FIG. 5.

FIG. 6 is an enlarged view of L-shaped slit 44 and connecting portion 45. Slit 44 is formed in an L-shape in the vicinity of the holding portion of printed wiring board 10 to surround the holding portion, and has first straight portion (44V) formed along a long side of printed wiring board 10, second straight portion (44H) formed to be perpendicular to first straight portion (44V), and third straight portion (44C) connecting first straight portion (44V) and second straight portion (44H). The angle made by an extended line from first straight portion (44V) and third straight portion (44C) is approximately 45 degrees, and the angle made by an extended line from second straight portion (44H) and third straight portion (44C) is approximately 45 degrees. Length (Y1) (length of L-shaped slit in a direction Y) obtained by adding the length of first straight portion (44V) and the length of a component of third straight portion (44C) extended in a direction along the first straight portion is 18 mm. Length (X1) (length of L-shaped slit in a direction X) obtained by adding the length of second straight portion (44H) and the length of a component of third straight portion (44C) extended in a direction along the second straight portion is 18 mm. The length of first straight portion (44V) is equal to the length of second straight portion (44H).

Connecting portion 45 is a portion connecting from an intermediate point of first straight portion (44V) to opening 30. Thus, printed wiring board 10 is accommodated in opening 30 of metal frame (30G) while its four corners of protruding tabs 16 are each held by a portion of metal frame (30G) structured to be surrounded by opening 30, L-shaped slit 44 and connecting portion 45 (hereinafter also referred to as holding portion 46). Here, width (w3) of first straight portion (44V) is 3 mm, for example, and width (w4) of connecting portion 45 is 1 mm, for example, which is smaller than width (w3) of first straight portion (44V).

Figures 8A, 8B:
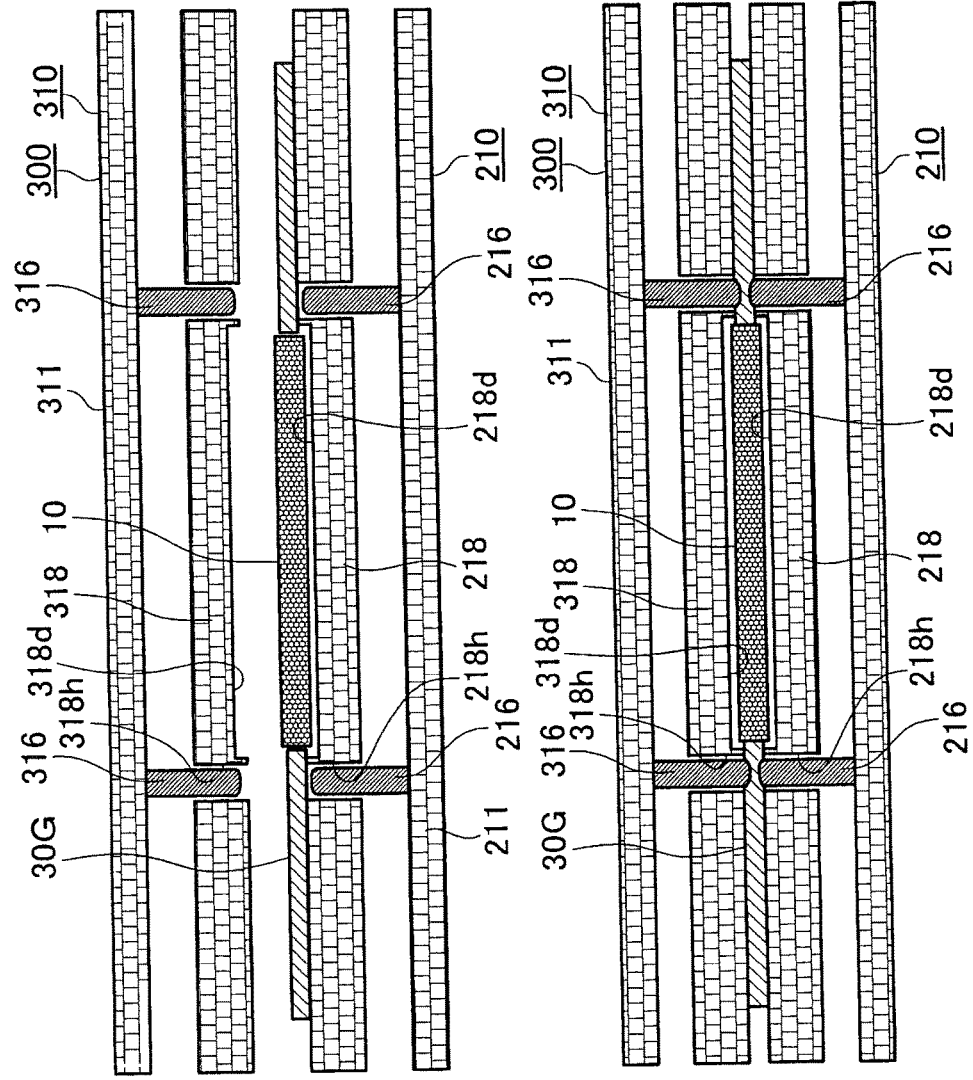
FIG. 8 (A)-8(B) are cross-sectional views of a crimping tool.

FIG. 8(A) is a cross-sectional view of crimping tool 300 to conduct crimping on printed wiring board 10. Crimping tool 300 has lower die 210 and upper die 310. Lower die 210 has base portion 211 and support plate 218. Support plate 218 is supported to be vertically movable with respect to base portion 211. Punches 216 for crimping are provided for base portion 211, and penetrating holes (218h) for punches 216 to pass through are formed in support plate 218. In the central portion of support plate 218, recessed portion (218d) is formed so as not to exert force on printed wiring board 10 during crimping. Metal frame (30G) is placed on support plate 218 in such a way that printed wiring board 10 is positioned on recessed portion (218d) with a predetermined space between them.

Upper die 310 has base portion 311 and support plate 318. Support plate 318 is supported to be vertically movable with respect to base portion 311. Punches 316 for crimping are provided for base portion 311, and penetrating holes (318h) for punches 316 to pass through are formed in support plate 318. Recessed portion (318d) is formed in the center of support plate 318 so that no force is exerted on printed wiring board 10 during crimping.

FIG. 8(B) is a view showing a state where upper die 310 is pressed against lower die 210, punches 316 of upper die 310 are pressed against the upper surface of metal frame (30G), and punches 216 of lower die 210 are pressed against the lower surface of metal frame (30G). In each of three accommodation openings 30 of metal frame (30G) shown in FIG. 4(B), first crimped portion (36a) and second crimped portion (36b) are formed simultaneously as shown in FIG. 5. Accordingly, combined wiring board 100 ready for reflow is completed where each printed wiring board 10 is held in place by metal frame (30G). Since outward stress is exerted on printed wiring board 10 when a greater degree of deformation is caused on second crimped portion (36b) positioned closer to the center as mentioned above, the degree of deformation on second crimped portion (36b) during crimping is greater than that on first crimped portion (36a).

In a combined wiring board of the first embodiment, since crimped portions (36a, 36b) are formed simultaneously in each of three accommodation openings 30, accurate alignment of printed wiring boards 10 is achieved with respect to metal frame (30G). Here, compared with a combined wiring board where an adhesive agent or the like is used for fixing printed wiring boards 10 to the frame, crimping is conducted simultaneously on all printed wiring boards 10. Thus, alignment with metal frame (30G) is accurate, and positional shifting among printed wiring boards is minimized. Moreover, compared with an alignment method using an adhesive agent, since the steps for filling and curing the adhesive agent are not required, there are fewer manufacturing steps. Thus, productivity is enhanced and the cost of fixing printed wiring boards 10 to metal frame (30G) is reduced.

When printed wiring board 10 is fixed into accommodation opening 30 of metal frame (30G) shown in FIG. 5, solder is printed, an electronic component is placed, and reflow is conducted in a reflow oven for the purpose of mounting the electronic component. Since a reflow temperature of almost 200° C. exceeds the glass transition temperature (Tg) of the resin in printed wiring board 10, warping tends to occur in printed wiring board 10 because of the weight of the mounted electronic component and residual stress in the wiring board. In printed wiring board 10 fixed to metal frame (30G) of the first embodiment, stress toward the center, along with stress caused by the weight of electronic component 11, is generated as shown in FIG. 7(B). However, since the coefficient of thermal expansion along a main surface of metal frame (30G) is higher than that of printed wiring board 10 as described above, expansion of metal frame (30G) in a planar direction is greater than that of printed wiring board 10. Thus, on printed wiring board 10 fixed into accommodation opening 30, stress (F1) toward the periphery is exerted so as to cancel out the stress toward the center of printed wiring board 10. Accordingly, warping is unlikely to occur in the printed wiring board during the reflow process.

In the combined wiring board related to the present invention, printed wiring board 10 accommodated in opening 30 is held in place by holding portion 46 of metal frame (30G), which is surrounded by opening 30, slit 44 and connecting portion 45. Thus, stress exerted through the holding portion of metal frame (30G) is dispersed to slit 44 and connecting portion 45, and stress is less likely to propagate further. Accordingly, when a difference in the thermal expansion coefficients of printed wiring board 10 and metal frame (30G) causes a difference in the degrees of thermal deformation during a reflow process, stress generated by the difference in thermal deformation is less likely to affect printed wiring board 10 and metal frame (30G) because slit 44 and connecting portion 45 suppress the propagation of stress. In the present embodiment, stress caused by thermal expansion can be limited in a tensile direction. Therefore, warping caused by thermal deformation during a reflow process is suppressed in printed wiring board 10 and metal frame (30G).

Because of elastic deformation of holding portion 46, stress exerted through holding portions connected to metal frame (30G) is more likely to be dispersed. Since printed wiring board 10 is fixed to metal frame (30G) while elasticity is retained between them, when a difference in the thermal expansion coefficients of printed wiring board 10 and metal frame (30G) causes a difference in the degrees of thermal deformation during a reflow process, stress generated by the difference in thermal deformation is less likely to affect printed wiring board 10 and metal frame (30G) because holding portion 46 makes elastic deformation. Accordingly, warping caused by thermal deformation during a reflow process is suppressed in printed wiring board 10 and metal frame (30G).

FIG. 9 shows metal frame (30G) after bridge portion 19 between cut-out slits 18 is cut and main body 12 of printed wiring board 10 is separated. Extension piece 14 of printed wiring board 10 remains on the metal-frame (30G) side. In the first embodiment, since cut-out slits 18 are formed in advance, it is easier to separate main body 12 of printed wiring board 10.

Second Embodiment

Figure 12:
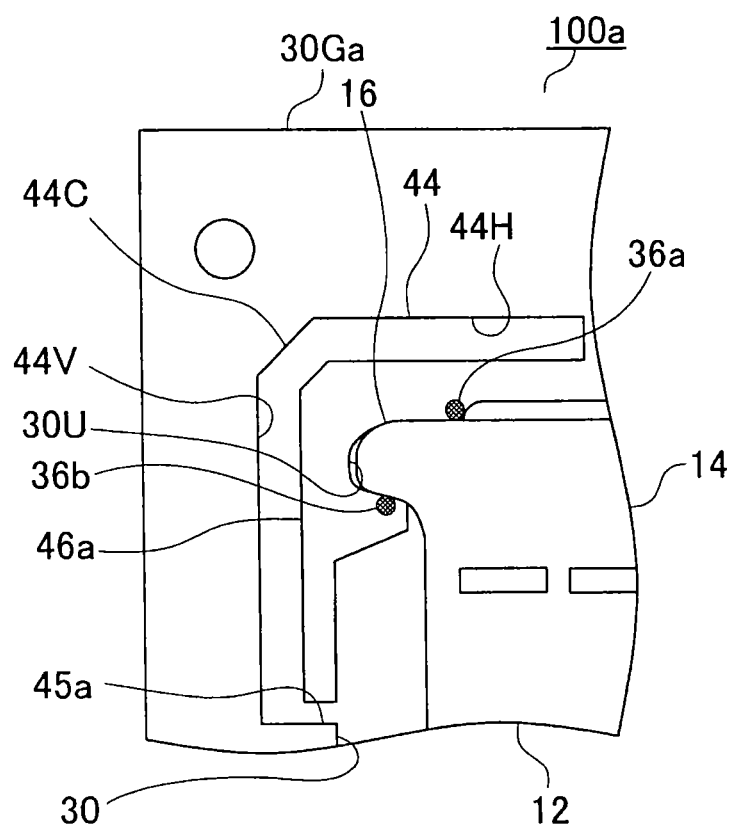
FIG. 12 is an enlarged view of an L-shaped slit and a connecting portion of a combined wiring board according to a second embodiment.

FIG. 12 is an enlarged view showing L-shaped slit 44 and connecting portion (45a) of combined wiring board (100a) according to a second embodiment. In metal frame (30Ga) of combined wiring board (100a) of the second embodiment, connecting portion (45a) is formed at a position farther from second straight portion (44H) so that opening 30 and an edge of first straight portion (44V) are connected and the space is enlarged between opening 30 and main body 12 or extension piece 14. Accordingly, printed wiring board 10 is accommodated in opening 30 of metal frame (30Ga) while its four corners at protruding tabs 16 are each held by holding portion (46a) of metal frame (30Ga), which is surrounded by opening 30, L-shaped slit 44 and connecting portion (45a).

As described, even if connecting portion (45a) is positioned to enlarge the space between opening 30 and main body 12 or extension piece 14, printed wiring board 10 accommodated in opening 30 is held by holding portion (46a). Thus, stress exerted through the holding portion in metal frame (30Ga) is dispersed by slit 44 and connecting portion (45a), and is less likely to propagate further. Accordingly, warping caused by thermal deformation is suppressed from occurring in printed wiring board 10 and metal frame (30Ga).

Third Embodiment

Figure 13:
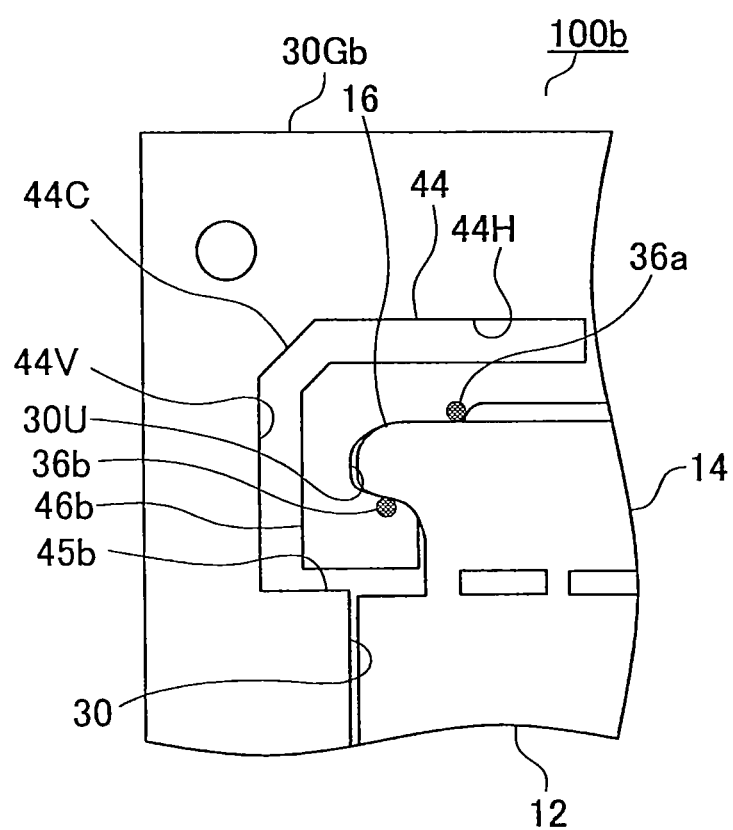
FIG. 13 is an enlarged view of an L-shaped slit and a connecting portion of a combined wiring board according to a third embodiment.

FIG. 13 is an enlarged view showing L-shaped slit 44 and connecting portion (45b) of combined wiring board (100b) according to a third embodiment. In metal frame (30Gb) of combined wiring board (100b) in the third embodiment, connecting portion (45b) is formed to connect opening 30 and an edge of first straight portion (44V), which is farther from second straight portion (44H). Accordingly, printed wiring board 10 is accommodated in opening 30 of metal frame (30G) while its four corners at protruding tabs 16 are each held by holding portion (46b) of metal frame (30Gb), surrounded by opening 30, L-shaped slit 44 and connecting portion (45b).

Printed wiring board 10 accommodated in opening 30 is held by holding portion (46b) by the above structure as well. Accordingly, stress exerted through the holding portion connected to metal frame (30Gb) is dispersed by slit 44 and connecting portion (45b), and warping caused by thermal deformation is suppressed from occurring in printed wiring board 10 and metal frame (30Gb).

In the first through third embodiments, metal frames (30G, 30Ga, 30Gb) are each preferred to have higher rigidity at reflow temperatures than printed wiring board 10.

When the temperature of heat applied to a wiring board during a solder reflow process for mounting an electronic component exceeds the glass transition temperature (Tg) of the material in the wiring board, warping occurs in the wiring board due to the weight of the mounted electronic component and residual stress in the wiring board.

A combined wiring board according to an embodiment of the present invention and its manufacturing method according to an embodiment of the present invention suppress warping of a wiring board and of a metal frame caused by thermal deformation.

A combined wiring board according to an embodiment of the present application has wiring boards and a metal frame that has openings to accommodate wiring boards and surrounds the wiring boards. In an opening into which a wiring board is accommodated, multiple portions of the wiring board are held by part of the sidewall of the opening. In the metal frame, a slit is formed near the portion that holds the wiring board, and a connecting portion is also formed to connect the slit and the opening.

In a combined wiring board according to an embodiment of the present application, a wiring board accommodated in an opening is held in place by a portion of the metal frame that is surrounded by the opening, a slit and a connecting portion (hereinafter may also be referred to as a holding portion). Thus, stress exerted through the holding portion of the metal frame is dispersed by the slit, and is less likely to propagate further. Accordingly, when a difference in the thermal expansion coefficients of a wiring board and the metal frame causes a difference in the degrees of thermal deformation, stress generated by the difference in thermal deformation is less likely to affect the wiring board and the metal frame because the propagation of the stress is suppressed by the slit. Thus, warping caused by thermal deformation is reduced in the wiring board and metal frame.

Obviously, numerous modifications and variations of the present invention are possible in light of the above teachings. It is therefore to be understood that within the scope of the appended claims, the invention may be practiced otherwise than as specifically described herein.

What is claimed is:

1. A combined wiring board, comprising:
a metal frame having a plurality of opening portions; and
a plurality of wiring boards accommodated in the plurality of opening portions in the metal frame, respectively,
wherein the metal frame has side walls defining the plurality of opening portions and having a plurality of holding portions positioned such that the holding portions hold the wiring boards in the opening portions in the metal frame, the metal frame has a plurality of slit portions and a plurality of connecting portions and is formed such that the plurality of holding portions is formed between the slit portions and the opening portions and that the plurality of connecting portions is connecting the slit portions to the opening portions, and the plurality of holding portions includes a plurality of crimped portions formed by plastic deformation.

2. A combined wiring board according to claim 1, wherein the metal frame comprises a metal material having a higher thermal expansion coefficient than a thermal expansion coefficient of the wiring boards such that the plurality of crimped portions is formed by the plastic deformation.

3. A combined wiring board according to claim 2, wherein the plurality of holding portions is positioned adjacent to corner portions of the opening portions, and the plurality of slit portions is formed in the metal frame such that each of the slit portions surrounds each of the corner portions of the opening portions.

4. A combined wiring board according to claim 3, wherein each of the slit portions has a first straight portion extending along a long side of each of the wiring boards and a second straight portion extending along a short side of each of the wiring boards, and each of the connecting portions is connected to the first straight portion of each of the slit portions.

5. A combined wiring board according to claim 4, wherein each of the connecting portions is connected to the first straight portion of each of the slit portions at an intermediate point of the first straight portion.

6. A combined wiring board according to claim 4, wherein each of the connecting portions is connected to the first straight portion of each of the slit portions at a far end point of the first straight portion from the second straight portion.

7. A combined wiring board according to claim 1, wherein the plurality of holding portions is positioned adjacent to corner portions of the opening portions, and the plurality of slit portions is formed in the metal frame such that each of the slit portions surrounds each of the corner portions of the opening portions.

8. A combined wiring board according to claim 7, wherein each of the slit portions has a first straight portion extending along a long side of each of the wiring boards and a second straight portion extending along a short side of each of the wiring boards, and each of the connecting portions is connected to the first straight portion of each of the slit portions.

9. A combined wiring board according to claim 8, wherein each of the connecting portions is connected to the first straight portion of each of the slit portions at an intermediate point of the first straight portion.

10. A combined wiring board according to claim 8, wherein each of the connecting portions is connected to the first straight portion of each of the slit portions at a far end point of the first straight portion from the second straight portion.

11. A method for manufacturing a combined wiring board, comprising:
preparing a plurality of wiring boards;
preparing a metal frame having a plurality of opening portions;
positioning the plurality of wiring boards in the plurality of opening portions in the metal frame, respectively; and
forming a plurality of holding portions in side walls of the opening portions in the metal frame by plastic deformation such that the holding portions hold the wiring boards in the opening portions in the metal frame, wherein the metal frame has a plurality of slit portions and a plurality of connecting portions and is formed such that the plurality of holding portions is formed between the slit portions and the opening portions and that the plurality of connecting portions is connecting the slit portions to the opening portions, and the plurality of holding portions includes a plurality of crimped portions formed by the plastic deformation.

12. A method for manufacturing a combined wiring board according to claim 11, wherein the preparing of the metal frame includes forming the plurality of slit portions in the metal frame and forming the plurality of connecting portions connecting the slit portions to the opening portions in the metal frame.

13. A method for manufacturing a combined wiring board according to claim 11, wherein the metal frame comprises a metal material having a higher thermal expansion coefficient than a thermal expansion coefficient of the wiring boards such that the plurality of crimped portions is formed by the plastic deformation.

14. A method for manufacturing a combined wiring board according to claim 13, wherein the plurality of holding portions is positioned adjacent to corner portions of the opening portions, and the plurality of slit portions is formed in the metal frame such that each of the slit portions surrounds each of the corner portions of the opening portions.

15. A method for manufacturing a combined wiring board according to claim 14, wherein each of the slit portions has a first straight portion extending along a long side of each of the wiring boards and a second straight portion extending along a short side of each of the wiring boards, and each of the connecting portions is connected to the first straight portion of each of the slit portions.

16. A method for manufacturing a combined wiring board according to claim 15, wherein each of the connecting portions is connected to the first straight portion of each of the slit portions at an intermediate point of the first straight portion.

17. A method for manufacturing a combined wiring board according to claim 11, wherein the plurality of holding portions is positioned adjacent to corner portions of the opening portions, and the plurality of slit portions is formed in the metal frame such that each of the slit portions surrounds each of the corner portions of the opening portions.

18. A method for manufacturing a combined wiring board according to claim 17, wherein each of the slit portions has a first straight portion extending along a long side of each of the wiring boards and a second straight portion extending along a short side of each of the wiring boards, and each of the connecting portions is connected to the first straight portion of each of the slit portions.

19. A method for manufacturing a combined wiring board according to claim 18, wherein each of the connecting portions is connected to the first straight portion of each of the slit portions at an intermediate point of the first straight portion.

20. A method for manufacturing a combined wiring board according to claim 19, wherein each of the connecting portions is connected to the first straight portion of each of the slit portions at a far end point of the first straight portion from the second straight portion.

* * * * *